(12) United States Patent
Lee

(10) Patent No.: US 8,779,800 B2
(45) Date of Patent: Jul. 15, 2014

(54) CONTROL SIGNAL GENERATION CIRCUIT AND SENSE AMPLIFIER CIRCUIT USING THE SAME

(71) Applicant: Yin Jae Lee, Icheon-si (KR)

(72) Inventor: Yin Jae Lee, Icheon-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 13/730,292

(22) Filed: Dec. 28, 2012

(65) Prior Publication Data

US 2013/0114331 A1 May 9, 2013

Related U.S. Application Data

(62) Division of application No. 12/459,365, filed on Jun. 29, 2009, now Pat. No. 8,354,863.

(30) Foreign Application Priority Data

Nov. 4, 2008 (KR) .......................... 10-2008-0109090

(51) Int. Cl.
*G01R 19/00* (2006.01)

(52) U.S. Cl.
USPC .............................................. 327/51; 327/52

(58) Field of Classification Search
USPC ................... 327/51, 52, 57; 365/205, 207
See application file for complete search history.

(56) References Cited

U.S. PATENT DOCUMENTS

| 8,354,863 B2 * | 1/2013 | Lee | 327/51 |
| 2003/0016565 A1 | 1/2003 | Jang et al. | |
| 2007/0195606 A1 | 8/2007 | Urabe et al. | |
| 2007/0205824 A1 | 9/2007 | Perisetty | |
| 2008/0219073 A1 | 9/2008 | Kang | |
| 2008/0298151 A1 | 12/2008 | Xi | |
| 2009/0096487 A1 * | 4/2009 | Chi | 327/51 |

FOREIGN PATENT DOCUMENTS

| KR | 10-0771545 B1 | 10/2007 |
| KR | 10-2008-0085300 A | 9/2008 |

OTHER PUBLICATIONS

Office Action issued Mar. 16, 2011 in connection with U.S. Appl. No. 12/459,365, filed Jun. 29, 2009.
Office Action issued Sep. 15, 2011 in connection with U.S. Appl. No. 12/459,365, filed Jun. 29, 2009.
Office Action issued Jan. 30, 2012 in connection with U.S. Appl. No. 12/459,365, filed Jun. 29, 2009.
Office Action issued Jun. 8, 2012 in connection with U.S. Appl. No. 12/459,365, filed Jun. 29, 2009.
Notice of Allowance issued Sep. 13, 2012 in connection with U.S. Appl. No. 12/459,365, filed Jun. 29, 2009.

* cited by examiner

*Primary Examiner* — Long Nguyen
(74) *Attorney, Agent, or Firm* — John P. White; Cooper & Dunham LLP

(57) ABSTRACT

A control signal generation circuit includes a voltage detection unit which detects a level of an external voltage and generates first and second detection signals and a control signal control unit which delays a sense amplifier enable signal in response to the first and second detection signals and generates first through third control signals. The enable period of the first and second control signals are controlled based on the levels of the first and second detection signals.

10 Claims, 6 Drawing Sheets

CONTROL SIGNAL GENERATION CIRCUIT AND SENSE AMPLIFIER CIRCUIT USING THE SAME

TECHNICAL FIELD

This disclosure relates to a sense amplifier circuit, and more particularly, to a control signal generation unit capable of controlling an overdrive period according to a level of an external voltage and a sense amplifier circuit using the same.

BACKGROUND

With technical development in a computer system or a field of electronics and communications, a semiconductor memory device used for storing information comes to have a low cost, a reduced size and a large capacity, and demands for energy efficiency have also increased. Accordingly, technical development of semiconductor memory devices tends towards restriction of unnecessary current consumption.

In general, a cell array for storing data of a dynamic random access memory (DRAM) device has a structure in that a number of cells, each of which is formed of one n-type metal oxide silicon (NMOS) transistor and one capacitor, are respectively connected to word lines and bit lines, which are connected to each other in the form of a matrix.

Operation of a conventional DRAM device will be briefly described hereinafter.

First, when a /RAS signal or a main signal for operating a DRAM device goes into an active state (low level), address signals are inputted to a row address buffer and row decoding operation for decoding the inputted row address signals and selecting one of the word line in the cell array is then performed.

At this time, when data in the cells connected to the selected word line is loaded on a bit line pair formed of a bit line BL and a complementary bit line /BL, a sense amplifier enable signal indicating a time-point of operation of a sense amplifier is enabled to drive a to sense amplifier driving circuit in a cell block selected by the row address. Further, sense amplifier bias voltages are shifted to a core voltage VCORE and a ground voltage VSS, respectively, by the sense amplifier driving circuit to drive a sense amplifier latch. When the sense amplifier latch begins to operate, a minute potential difference which is being maintained in the bit line pair BL, /BL is shifted to a large potential difference and a column decoder selected by the column address thereafter turns on a column transfer transistor for transferring data on the bit line to a data bus line, thereby transferring the data transferred to the bit line pair BL, /BL to data bus lines DB, /DB and outputting the data to outside of the device.

That is, in such operation, the bit line pair BL, /BL is precharged to a bit line precharge voltage VBLP in a standby mode before the DRAM device begins to operate and comes to have a minute potential difference therebetween as the data of the cell is transferred thereto when the device is operated. In this state, when the sense amplifier latch begins to operate, potentials of the bit line pair BL, /BL, which is maintained at a minute potential difference therebetween, go into the core potential Vcore and the ground potential Vss, respectively. The data on the bit lines having the amplified potentials is transferred to the data bus lines DB, /DB by a column decoder output signal yi.

However, at a time point where the sense amplifier latch applied with the core voltage VCORE as the sense amplifier bias voltage begins to operate, the core voltage is sharply lowered since a large current is consumed all at once. Therefore, to solve this problem, there is widely employed a method of shorting the external voltage VDD and the core voltage VCORE and applying the external voltage VDD with the core voltage VCORE at a time point where the sense amplifier begins to operate, and this is referred to as sense amplifier overdriving.

FIG. 1 is a block diagram illustrating a conventional sense amplifier circuit employed with sense amplifier overdriving.

As illustrated in FIG. 1, the conventional sense amplifier circuit includes a control signal generation unit 7, a sense amplifier driving unit 8 and a sense amplifier latch unit 9. The control signal generation unit 7 receives a sense amplifier enable signal SAEN for driving the sense amplifier circuit, and generates a first control signal SAP1B enabled for driving a first sense amplifier bias voltage RTO with the external voltage VDD, a second control signal SAP2B enabled for driving the first sense amplifier bias voltage RTO with the core voltage VCORE and a third control signal SAN enabled for driving a second sense amplifier bias voltage SB with the ground voltage VSS.

The sense amplifier driving unit 8 receives the first control signal SAP1B, the second control signal SAP2B and the third control signal SAN and drives the first sense amplifier bias voltage RTO and the second amplifier bias voltage SB. The sense amplifier latch unit 9 receives the first sense amplifier bias voltage RTO and the second amplifier bias voltage SB and latches the voltage of the bit line pair.

FIG. 2 shows waveforms of the first control signal SAP1B, the second control signal SAP2B and the third control signal SAN generated in the control signal generation unit 7. First, the first control signal SAP1B is enabled to a low level during a predetermined period after the sense amplifier enable signal SAEN is enabled to a high level (hereinafter, referred to as 'overdriving period D'), and drives the first sense amplifier bias voltage RTO with the external voltage VDD. Next, the second control signal SAP2B is enabled to a low level during a period where the overdriving period D is terminated and the sense amplifier enable signal SAEN is enabled to a high level, and drives the first sense amplifier bias voltage RTO with the core voltage VCORE. Next, the third control signal SAN is enabled to a high level in a period where the sense amplifier enable signal SAEN is enabled to a high level, and drives the second sense amplifier bias voltage SB with a ground voltage VSS.

However, in the conventional sense amplifier circuit, the enable period of the first control signal SAP1B for setting the overdriving period is determined regardless of the level of the external voltage VDD. Therefore, there is a problem that when the level of the external voltage VDD is high, the overdriving period is too long and a leakage current flowing from the external voltage VDD to the core voltage VCORE is increased and thus current consumption is increased, and when the level of the external voltage VDD is low, a speed of driving the first sense amplifier voltage RTO is slowed down and the operation speed of the sense amplifier circuit is dropped.

BRIEF SUMMARY

In an aspect of this disclosure, there is provided a control signal generation unit which, in generation of a control signal for controlling a driving of a sense amplifier bias voltage, controls a delay period of a delay unit, which is used to generate the control signal, based on a level of an external voltage and thus controls an overdriving period based on the level of the external voltage, thereby capable of reducing a leakage current and enhancing an operation speed, and a sense amplifier circuit using the same.

In an embodiment, a control signal generation circuit includes a voltage detection unit which detects a level of an external voltage and generates first and second detection signals, and a control signal control unit which delays a sense amplifier enable signal in response to the first and second detection signals and generates first through third control signal, wherein the enable period of the first and second control signals are controlled based on the levels of the first and second detection signals.

In another embodiment, a sense amplifier circuit includes a control signal generation unit which delays a sense amplifier enable signal by a predetermined period and generates first through third control signals, wherein the delay period is controlled based on a level of an external voltage, a sense amplifier driving unit which receives the first through third control signals and drives first and second sense amplifier bias voltages, and a sense amplifier latch unit which receives the first and second sense amplifier bias voltages and latches a bit line pair.

BRIEF DESCRIPTION OF THE DRAWINGS

The above and other aspects, features and advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intend to limit the scope of the invention.

Figure 1:
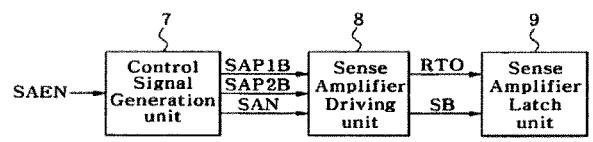
FIG. 1 is a block diagram illustrating a conventional sense amplifier employed with sense amplifier overdriving.
Figure 2:
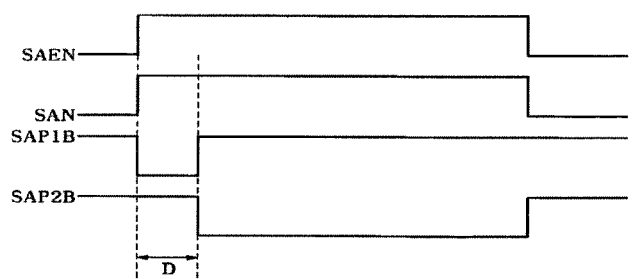
FIG. 2 is a timing diagram explaining operation of the sense amplifier circuit illustrated in FIG. 1.
Figure 3:
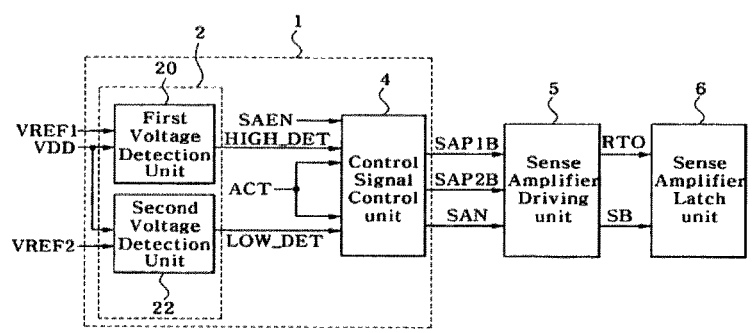
FIG. 3 is a block diagram illustrating a configuration of a sense amplifier circuit in accordance with an embodiment of the present invention.

FIG. 3 is a block diagram illustrating a configuration of a sense amplifier circuit in accordance with an embodiment of the present invention.

The sense amplifier circuit illustrated in FIG. 3 includes a control signal generation circuit 1, a sense amplifier driving unit 5 and a sense amplifier latch unit 6.

The control signal generation unit 1 includes a voltage detection unit 2 having a first voltage detection unit 20 and a second voltage detection unit 22, and a control signal control unit 4. The first voltage detection unit 20 compares the level of an external voltage VDD with the level of a first reference voltage VREF1 and generates a first detection signal HIGH_DET_enabled to a high level when the level of the external voltage VDD is higher than the level of the first reference voltage VREF1. The second voltage detection unit 22 compares the level of the external voltage VDD with the level of a second reference voltage VREF2 and generates a second detection signal LOW_DET enabled to a high level when the level of the external voltage VDD is lower than the level of the second reference voltage VREF2. Here, the first voltage detection unit 20 and the second voltage detection unit 22 can be realized by a general voltage comparison circuit.

Figure 4:
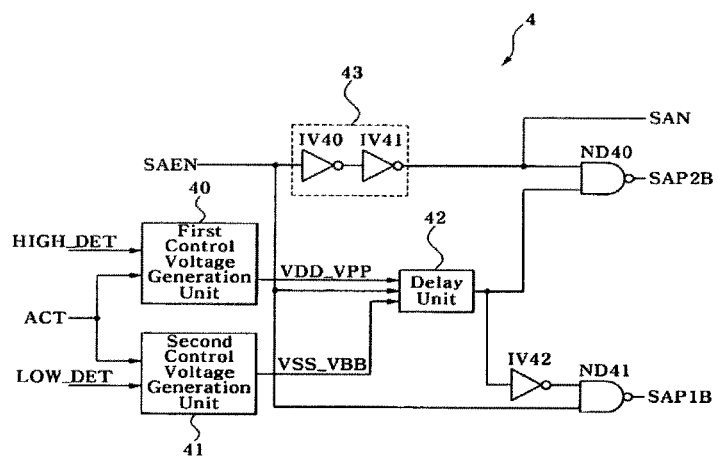
FIG. 4 is a view illustrating a control signal control unit included in the sense amplifier circuit of FIG. 3.

Referring to FIG. 4, the control signal control unit 4 includes a first control voltage generation unit 40, a second control voltage generation unit 41, a delay unit 42, a buffer unit 43 and NAND gates NO40, ND41. Here, the buffer unit 43 includes inverters IV40, IV41 which buffer a sense amplifier enable signal SAEN inputted thereto and generates a third control signal SAN for driving the second sense amplifier bias voltage SB with a ground voltage VSS. The NAND gate ND40 performs a logic AND operation on an output signal of the buffer unit 43 and an output signal of the delay unit 42 inputted thereto and generates a second control signal SAP2B for driving a first sense amplifier bias voltage RTO with a core voltage VCORE. The NAND gate ND41 performs a logic AND operation on the sense amplifier enable signal SAEN and an inverted signal of the output signal of the delay unit 42 inputted thereto and generates a first control signal SAP1B for driving the first sense amplifier bias voltage RTO with the external voltage VDD.

Figure 5:
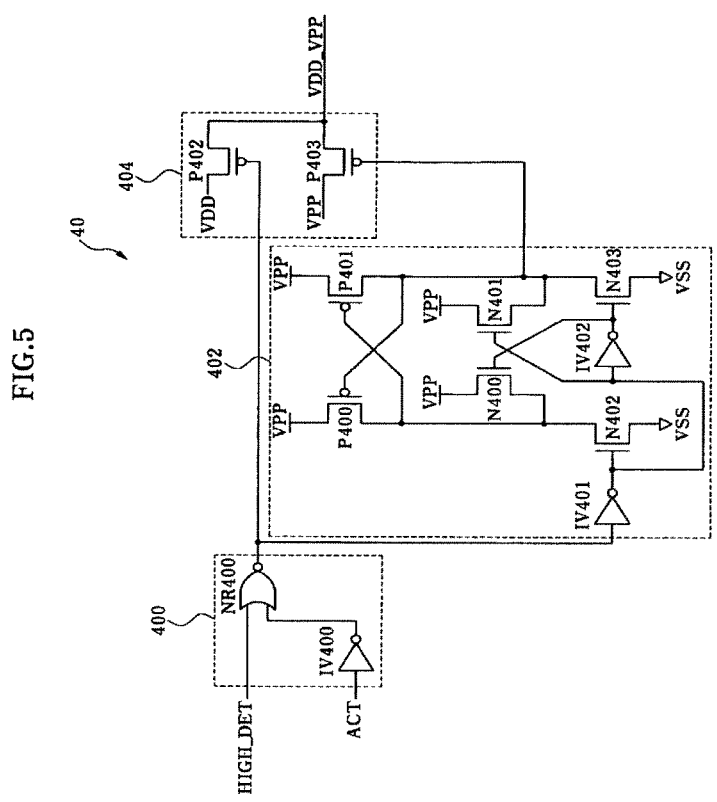
FIG. 5 is a circuit diagram illustrating a first control voltage generation unit included in the control signal control unit of FIG. 4.

Referring to FIG. 5, the first control voltage generation unit 40 includes a transfer unit 400 which buffers and transfers the first detection signal HIGH_DET in response to the active signal ACT enabled to a high level upon the active operation, a first level shifter 402 which inverts an output signal of the transfer unit 400 and level-shifts the level of the inverted signal to the level of a high voltage VPP, and a first selection unit 404 which selectively transfers the external voltage VDD or the high voltage VPP to a first control signal VDD_VPP in response to an output signal of the first level shifter 402. The first selection unit 404 includes a PMOS transistor P402 turned on in response to the output signal of the transfer unit 400 and a PMOS transistor P403 turned on in response to the output signal of the first level shifter 402. In the first control voltage generation unit 40 having the configuration as described above, the PMOS transistor P402 is turned on to transfer the external voltage VDD to the first control signal VDD_VPP when the first detection signal HIGH_DET is at a high level, and the PMOS transistor P403 is turned on to transfer the high voltage VPP to the first control signal VDD_VPP when the first detection signal HIGH_DET is at a low level.

Figure 6:
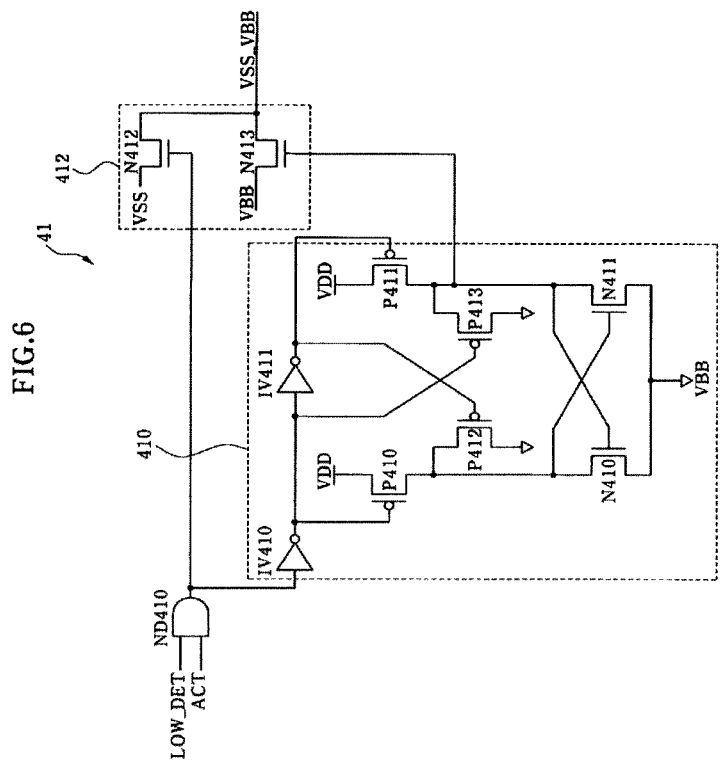
FIG. 6 is a circuit diagram illustrating a second control voltage generation unit included in the control signal control unit of FIG. 4.

Referring to FIG. 6, the second control voltage generation unit 41 includes a NAND gate ND410 or a transfer device which buffers and transfers the second detection signal LOW_DET in response to the active signal ACT, a second level shifter 410 which inverts an output signal of the NAND gate ND410 and level-shifts the level of the inverted signal to the level of a back bias voltage VBB, and a second selection unit 412 which selectively transfers the ground voltage VSS or the back bias voltage VBB to a second control signal VSS_VBB in response to an output signal of the second level shifter 410. The second selection unit 412 includes an NMOS transistor N412 turned on in response to the output signal of the NAND gate ND410 and an NMOS transistor P413 turned on in response to the output signal of the second level shifter 410. In the second control voltage generation unit 41 having the configuration as described above, the NMOS transistor N413 is turned on to transfer the back bias voltage VBB to the second control signal VSS_VBB when the second detection signal LOW_DET is at a high level, and the NMOS transistor N412 is turned on to transfer the ground voltage VSS to the second control signal VSS_VBB when the second detection signal LOW_DET is at a low level.

Figure 7:
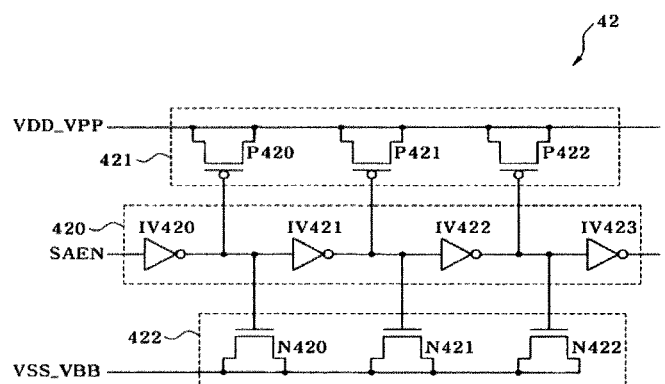
FIG. 7 is a circuit diagram illustrating a delay unit included in the control signal control unit of FIG. 4.

Referring to FIG. 7, the delay unit 42 includes an inverter chain 420 having inverters IV420-IV423 which delay the sense amplifier enable signal SAEN by a predetermined period, a first delay control unit 421 which controls the delay period of the inverter chain 420 in response to the first control signal VDD_VPP and a second delay control unit 422 which controls the delay period of the inverter chain 420 in response to the second control signal VSS_VBB. The first delay control unit 421 includes PMOS transistors P420-P422, each having a gate connected to an output node of the respective inverters IV420-IV422 and a source and drain connected to the first control signal VDD_VPP. The second delay control unit 422 includes NMOS transistors N420-N422, each having a gate connected to an output node of the respective inverters IV420-IV422 and a source and drain connected to the second control signal VSS_VBB. Here, the PMOS transistors P420-P422 of the first delay control unit 421 function as a capacitor of which capacitance is increased as the level of the first control signal VDD_VPP is increased, and the NMOS transistors N420-N422 of the second delay control unit 422 function as a capacitor of which capacitance is increased as the level of the first control signal VSS_VBB is decreased. Since a RC delay is increased as the capacitances of the first delay control unit 421 and the second delay control units 422 are increased, the delay period of the delay unit 42 is increased.

Figure 8:
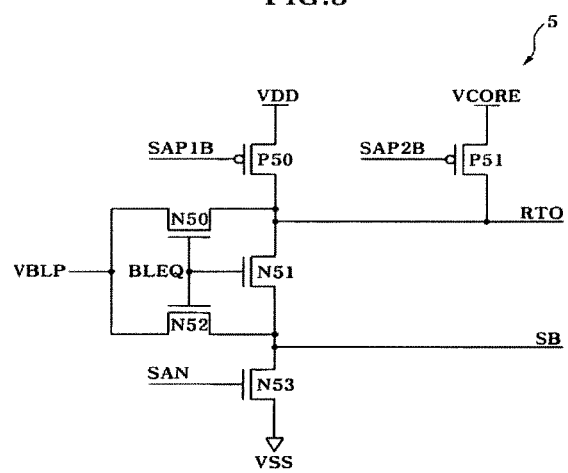
FIG. 8 is a circuit diagram illustrating a sense amplifier driving unit included in the sense amplifier circuit of FIG. 3.

Referring to FIG. 8, the sense amplifier driving unit 5 includes a PMOS transistor P50 which supplies the external voltage VDD to the first sense amplifier bias voltage RTO in response to the first control signal SAP1B, a PMOS transistor P51 which supplies an internal voltage VCORE to the first sense amplifier bias voltage RTO in response to the second control signal SAP2B, an NMOS transistor N53 which supplies the ground voltage VSS to the second sense amplifier bias voltage SB in response to the third control signal SAN, and NMOS transistors N50-N52 which precharge the first sense amplifier bias voltage RTO and the second sense amplifier bias voltage SB to the bit line precharge voltage VBLP in response to a bit line equalization signal BLEQ.

Figure 9:
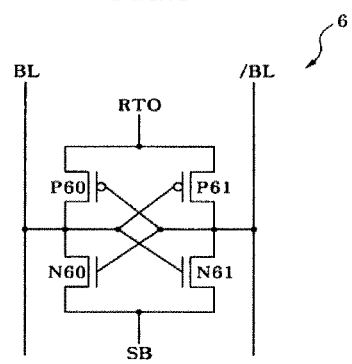
FIG. 9 is a circuit diagram illustrating a sense amplifier latch unit included in the sense amplifier circuit of FIG. 3.

Referring to FIG. 9, the sense amplifier latch unit 6 includes PMOS transistors P60, P61 and NMOS transistors N60, N61, which receive the first sense amplifier bias voltage RTO and the second sense amplifier bias voltage SB and latch the potential of the bit line pair BL, /BL. The sense amplifier latch unit 6 is realized by a general cross coupled latch circuit.

Operation of the sense amplifier circuit configured as described above will be described with reference to FIG. 10.

The first voltage detection unit 20 of the voltage detection unit 2 compares the level of the external voltage VDD with the level of the first reference voltage VREF1 and generates the first detection signal HIGH_DET enabled to a high level when the level of the external voltage VDD is higher than the level of the first reference voltage VREF1. Also, the second voltage detection unit 22 compares the level of the external voltage VDD with the level of the second reference voltage VREF2 and generates the second detection signal LOW_DET enabled to a high level when the level of the external voltage VDD is lower than the level of the second reference voltage VREF2.

The control signal control unit 4 receives the sense amplifier enable signal SAEN, the first detection signal HIGH_DET, the second detection signal LOW_DET and the active signal ACT and generates the first control signal SAP1B, the second control signal SAP2B and the third control signal SAN. Here, the third control signal SAN is generated by buffering the sense amplifier enable signal SAEN, the first control signal SAP1B is enabled to a low level during a delay period after the sense amplifier enable signal SAEN is enabled to a high level, i.e., during the overdriving period, and the second control signal SAP2B is enabled to a low level until the sense amplifier enable signal SAEN is disabled to a low level after the overdriving period D is terminated. Hereinafter, operation of the control signal control unit 4 will be described in more detail by the level of the external voltage VDD.

First, when the level of the external voltage VDD is higher than the level of the first reference voltage VREF1, the first detection signal HIGH_DET becomes a high level and the second detection signal LOW_DET becomes a low level. The first control voltage generation unit 40 receives the first detection signal HIGH_DET of a high level and generates the first control signal VDD_VPP with the external voltage VDD, and the second control voltage generation unit 41 receives the second detection signal LOW_DET of a low level and generates the second control signal VSS_VBB with the ground voltage VSS.

More specifically, the NOR gate NR400 of the first control voltage generation unit 40 functions as an inverter by the active signal ACT enabled to a high level upon the active operation to invert the first detection signal HIGH_DET of a high level and outputs the inverted first detection signal, thereby turning on the PMOS transistor P402, and the first level shifter 402 inverts and level-shifts the output signal of the NOR gate NR400, and outputs an output signal having the level of the high voltage VPP, thereby turning off the PMOS transistor P402. Therefore, the first control voltage generation unit 40 generates the first control signal VDD_VPP with the external voltage VDD. Also, the NAND gate ND410 of the second control voltage generation unit 41 functions as an inverter by the active signal ACT to invert the second detection signal LOW_DET of a low level, thereby turning on the NMOS transistor N412, and the second level shifter 410 outputs an output signal having a level of the back bias voltage VBB, thereby turning off the NMOS transistor N413. Therefore, the second control voltage generation unit 41 generates the second control signal VSS_VBB with the ground voltage VSS.

When the level of the external voltage VDD is lower than the level of the second reference voltage VREF2, the first detection signal HIGH_DET becomes a low level and the second detection signal LOW_DET becomes a high level. Since the first detection signal HIGH_DET of a low level turns off the PMOS transistor P402 of the first control voltage generation unit 40 and turns on the PMOS transistor P403, the first control voltage generation unit 40 generates the first control signal VDD_VPP with the high voltage VPP. Also, since the second detection signal LOW_DET of a high level turns off the NMOS transistor N412 of the second control voltage generation unit 41 and turns on the NMOS transistor N413, the second control voltage generation unit 41 generates the second control signal VSS_VBB with the back bias voltage VBB.

When the level of the external voltage VDD is higher than the level of the second reference voltage VREF2 and is lower than the level of the first reference voltage VREF1, the first detection signal HIGH_DET and the second detection signal LOW_DET become a low level. As described above, the first control voltage generation unit 40 generates the first control signal VDD_VPP with the high voltage VPP by the first detection signal HIGH_DET of a low level, and the second control voltage generation unit 41 generates the second control signal VSS_VBB with the ground voltage VSS by the second detection signal LOW_DET of a low level.

When the level of the external voltage VDD is higher than the level of the first reference voltage VREF1, the first control voltage generation unit 40 generates the first control signal VDD_VPP with the external voltage VDD and the second control voltage generation unit 41 generates the second control signal VSS_VBB with the ground voltage VSS. Also, when the level of the external voltage VDD is lower than the level of the second reference voltage VREF2, the first control voltage generation unit 40 generates the first control signal VDD_VPP with the high voltage VPP and the second control voltage generation unit 41 generates the second control signal VSS_VBB with the back bias voltage VBB. Further, when the level of the external voltage VDD is higher than the level of the second reference voltage VREF2 and lower than the first reference voltage VREF1, the first control voltage generation unit 40 generates the first control signal VDD_VPP with the high voltage VPP and the second control voltage generation unit 41 generates the second control signal VSS_VBB with the ground voltage VSS. That is to say, when the level of the external voltage VDD is high, the level of the first control signal VDD_VPP is decreased and the level of the second control signal VSS_VBB is increased.

The first control signal VDD_VPP and the second control signal VSS_VBB generated as such control the delay period of the delay unit 42 for setting the overdriving period. The delay period of the delay unit 42 is increased as the capacitances of the first delay control unit 421 and the second delay control unit 422 are increased, in which the capacitance of the first delay control unit 421 is increased as the level of the first control signal VDD_VPP is increased and the capacitance of the second delay control unit 422 is increased as the level of the second control signal VSS_VB is decreased.

As described above, the first control signal VDD_VPP is generated with the external voltage VDD when the level of the external voltage VDD is higher than the level of the first reference voltage VREF1, and on the other hand, is generated with the high voltage VPP when level of the external voltage VDD is lower than the level of the first reference voltage VREF1, and the second control signal VSS_VBB is generated with the back bias voltage VBB when the level of the external voltage VDD is lower than the level of the second reference voltage VREF2, and on the other hand, is generated with the ground voltage VSS when level of the external voltage VDD is higher than the level of the second reference voltage VREF2. That is to say, as the level of the external voltage VDD is higher, the level of the first control signal VDD_VPP is lower and the level of the second control signal VSS_VBB is higher. Therefore, as the level of the external voltage VDD is higher, the capacitances of the first delay control unit 421 and the second delay control unit 422 are decreased and thus the delay period of the delay unit 42 is decreased. Also, as the level of the external voltage VDD is lower, the capacitances of the first delay control unit 421 and the second delay control unit 422 are increased and thus the delay period of the delay unit 42 is increased.

Figure 10:
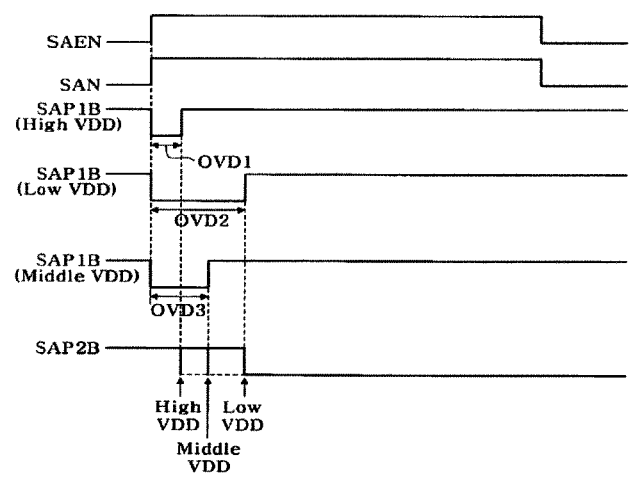
FIG. 10 is a timing diagram explaining operation of the sense amplifier circuit illustrated in FIG. 3.

As such, it can be seen through FIG. 10 that the delay period of the delay unit 42 is controlled depending on the external voltage VDD. As shown, the delay period of the delay unit 42 is decreased and an overdriving period OVD1 is formed short at a high external voltage VDD, and on the contrary, the delay period of the delay unit 42 is increased and an overdriving period OVD2 is formed long at a low external voltage VDD.

The sense amplifier driving unit 5 receives the first control signal SAP1B, the second control signal SAP2B and the third control signal SAN and drives the first sense amplifier bias voltage RTO and the second sense amplifier bias voltage SB, and the sense amplifier latch unit 6 receives the first sense amplifier bias voltage RTO and the second sense amplifier bias voltage SB and latches the potential of the bit line pair BL, /BL.

As is apparent from the above description, the sense amplifier circuit of the present invention controls the overdriving period based on the level of the external voltage VDD. By controlling the overdriving period as such, the overdriving is performed for a short period to reduce the current consumption when the level of the external voltage VDD is high and the overdriving is performed for a long period to increase the operation speed when the level of the external voltage VDD is low.

While the present invention has been described with respect to the specific embodiments, it will be apparent to those skilled in the art that various changes and modifications may be made without departing from the spirit and scope of the invention as defined in the following claims.

The present disclosure claims priority to Korean application number 10-2008-0109090, filed on Nov. 4, 2008, the entire contents of which are incorporated herein by reference.

What is claimed is:

1. A sense amplifier circuit comprising:
   a control signal generation unit which delays a sense amplifier enable signal by a predetermined period and generates first through third control signals, wherein the delay period is controlled based on a level comparison between an external voltage and first and second reference voltages;
   a sense amplifier driving unit which receives the first through third control signals and drives first and second sense amplifier bias voltages; and
   a sense amplifier latch unit which receives the first and second sense amplifier bias voltages and latches a bit line pair,
   wherein the first and second reference voltages have different respective levels.

2. The sense amplifier circuit of claim 1, wherein the control signal generation unit includes:
   a voltage detection unit which detects the level of the external voltage and generates first and second detection signals; and
   a control signal control unit which delays the sense amplifier enable signal in response to the first and second detection signals and generates the first through third control signals, wherein enable periods of the first and second control signals are controlled based on levels of the first and second detection signals.

3. The sense amplifier circuit of claim 2, wherein the voltage detection unit includes:
   a first voltage detection unit which generates the first detection signal enabled when the level of the external voltage is higher than a level of the first reference voltage; and
   a second voltage detection unit which generates the second detection signal enabled when the level of the external voltage is lower than a level of the second reference voltage.

4. The sense amplifier circuit of claim 2, wherein the control signal control unit includes:
  a first control voltage generation unit which outputs a first voltage or a second voltage to a first control voltage in response to the first detection signal;
  a second control voltage generation unit which outputs a third voltage or a fourth voltage to a second control voltage in response to the second detection signal; and
  a delay unit which delays the sense amplifier enable signal by a predetermined period in response to the first and second control voltages.

5. The sense amplifier circuit of claim 4, wherein the first control voltage generation unit includes:
  a first transfer device which transfers the first voltage to the first control voltage in response to the first detection signal; and
  a second transfer device which transfers the second voltage to the first control voltage in response to the first detection signal.

6. The sense amplifier circuit of claim 4, wherein the second control voltage generation unit includes:
  a first transfer device which transfers the third voltage to the second control voltage in response to the second detection signal; and
  a second transfer device which transfers the fourth voltage to the second control voltage in response to the second detection signal.

7. The sense amplifier circuit of claim 4, wherein the delay period of the delay unit is increased as a level of the first control signal is increased or a level of the second control signal is decreased.

8. The sense amplifier circuit of claim 7, wherein the delay unit includes:
  a first buffer for buffering the sense amplifier enable signal;
  a first capacitor connected to an output node of the first buffer, a capacitance of the first capacitor being controlled in response to the first control voltage; and
  a second capacitor connected to an output node of the first buffer, a capacitance of the second capacitor being controlled in response to the second control voltage.

9. The sense amplifier circuit of claim 8, wherein the first capacitor is a PMOS transistor, an output signal of the first buffer is applied to a gate of the PMOS transistor thereof and the first control voltage is supplied as source and drain voltages of the PMOS transistor.

10. The sense amplifier circuit of claim 8, wherein the second capacitor is an NMOS transistor, in which an output signal of the first buffer is applied to a gate of the NMOS transistor and the second control voltage is supplied as source and drain voltages of the NMOS transistor.

\* \* \* \* \*